(12) United States Patent
Bang et al.

(10) Patent No.: US 8,339,794 B2
(45) Date of Patent: Dec. 25, 2012

(54) SUPER CAPACITOR CASING AND SUPERCAPACITOR EMBEDDED DEVICE

(75) Inventors: Hyo-Jae Bang, Hwaseong-si (KR); Jung-Hyeon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 171 days.

(21) Appl. No.: 12/713,282

(22) Filed: Feb. 26, 2010

(65) Prior Publication Data

US 2010/0232124 A1 Sep. 16, 2010

(30) Foreign Application Priority Data

Mar. 10, 2009 (KR) .................. 10-2009-0020426

(51) Int. Cl.
*H05K 5/00* (2006.01)

(52) U.S. Cl. .................. 361/752; 361/728; 361/730

(58) Field of Classification Search .......... 361/728–730, 361/752, 796, 800, 761; 174/50, 100, 254; 505/150, 191, 238; 257/35, 39; 427/58, 427/62

See application file for complete search history.

(56) References Cited

U.S. PATENT DOCUMENTS

| | | | | |
|---|---|---|---|---|
| 5,038,250 | A * | 8/1991 | Uenaka et al. | 361/737 |
| 5,666,239 | A * | 9/1997 | Pottebaum | 360/99.23 |
| 6,469,864 | B2 * | 10/2002 | Kamezawa et al. | 360/97.21 |
| 7,031,113 | B2 * | 4/2006 | Ma | 360/133 |
| 7,292,407 | B2 | 11/2007 | Hirano et al. | |
| 7,369,415 | B2 * | 5/2008 | Kojima | 361/789 |
| 7,813,145 | B2 * | 10/2010 | Stoneham et al. | 361/818 |
| 7,869,218 | B2 * | 1/2011 | Ni et al. | 361/737 |
| 8,125,058 | B2 * | 2/2012 | Mueller et al. | 257/659 |
| 2009/0086448 | A1 * | 4/2009 | Hiew et al. | 361/753 |

FOREIGN PATENT DOCUMENTS

| | | |
|---|---|---|
| JP | 2006-107708 | 4/2006 |
| JP | 2007-095215 | 4/2007 |
| KR | 2006-0051874 | 5/2006 |
| KR | 2008-0014134 | 2/2008 |

* cited by examiner

*Primary Examiner* — Hung S Bui

(74) *Attorney, Agent, or Firm* — Stanzione & Kim, LLP

(57) ABSTRACT

A casing to support a solid state device SSD therein and super capacitors therein to be electronically connected together.

31 Claims, 13 Drawing Sheets

US 8,339,794 B2

SUPER CAPACITOR CASING AND SUPERCAPACITOR EMBEDDED DEVICE

CROSS-REFERENCE TO RELATED APPLICATIONS

This application claims the benefit of Korean Patent Application No. KR2009-0020426 filed with the Korea Industrial Property Office on Mar. 10, 2009, the disclosure of which is incorporated herein by reference in its entirety.

BACKGROUND OF THE INVENTION

1. Field of the Invention

The general inventive concept relates to a SSD (solid state drive) module and a super-capacitor (capacitors having more than 1 F (F=farad) being embedded into a casing, and the casing can perform operations of a physical connection and an electrical connection among the SSD module, the casing and the super-capacitor.

2. Description of the Related Art

A solid state device (SSD) is a memory data storage device that utilizes solid state memory (e.g.: flash type memory, non-volatile memory, etc.) to store persistent data. SSDs are an alternative to conventional hard drives that have slower memory data access times due to mechanical moving parts, or other drawbacks. The absence of rotating disks and mechanical devices in the SSD greatly improves electro-magnetic-interference (EMI), physical shock resistance and reliability.

Such SSDs can be supplied with voltage/power from an external power supply mainly, and the voltage of the external power supply may be 110V or 220V, etc. If the external power supply that supplies an SDD is suddenly cut off, the super-capacitor can function as an auxiliary power supply. However, there is a need to provide a supporting structure which provides physical and electrical support and connections between an SSD module and a super-capacitor.

There is also a need to provide separate support for a combination of electronic components and super-capacitors and an SSD to prevent problems such as interference of EMI, damage and/or loss of reliability of the components and super-capacitors due to shocks from external contacts.

SUMMARY

Features and utilities of the present general inventive concept may be achieved by providing a casing including a first case portion having a first plurality of through holes on a first surface thereof, the first case portion disposed on a second case portion to form a groove therebetween, the second case portion having a second plurality of through holes corresponding to respective ones of the first plurality of through holes; at least one super capacitor disposed on at least one of the first case portion and the second case portion; and a case mating medium disposed through each corresponding set of the first and second plurality of through holes to electrically connect the SSD module and the at least one super capacitor.

The SSD module may include a printed circuit board having a third plurality of through holes corresponding to respective ones of the first and second plurality of through holes to receive the case mating mediums therethrough.

The SSD module including the printed circuit board may have a width and depth less than a width and depth of the casing, and the third plurality of through holes may be formed of semicircles to surround a portion of the respective case mating medium extending therethrough.

The first plurality of through holes has a diameter greater than a diameter of the second and third plurality of through holes; and the case mating mediums have a first portion including a first diameter to correspond with the diameter of the first plurality of through holes and a second portion including a second diameter to correspond with the diameter of the second and third plurality of through holes.

The first and second case portion are formed of a compound comprising at least one of Fe, Al, Ni, Cu, Au, Ag, Epoxy resin, polymer and SiO2.

The case mating medium is formed of a compound comprising at least one of Fe, Al, Ni, Cu, Au, Ag, Epoxy resin, polymer and SiO2.

Features and utilities of the present general inventive concept may also be achieved by providing a super capacitor and SSD (solid state device) case including a cavity therein, comprising: an internal case portion and an external case portion providing top, side and bottom portions of the cavity, the internal case portion including a gap formed on an outer surface thereof to receive a super capacitor therein, the internal case portion being insertable into the external case portion to enclose the super capacitor therebetween inside the gap; and at least one case mating medium to extend through a respective hole extending through the internal and external case portions and through the cavity to provide an electrical connection between the super capacitor and electrical components to be disposed within the cavity.

The case mating medium may include a plurality of case mating mediums, each to extend through a corresponding hole extending through the internal and external case portions and the cavity.

The internal case portion may include protrusions extending from the side portions thereof inward into the cavity to receive a printed circuit board containing the electrical components thereon, the printed circuit board including hole extending therethrough to receive respective ones of the case mating mediums such that the electrical components are electrically connected with the at least one super capacitor.

The protrusions may include opposing protrusions to support opposite sides of the printed circuit board.

The internal case portion and the external case portion may further include a back portion to close a back portion of the case, the back portion including a back protrusion extending inwardly therefrom to support a back portion of the printed circuit board.

The gap may extend into the back portion to receive a portion of the super capacitor therein.

The capacitor case may further include at least one auxiliary super capacitor disposed on an internal surface of the internal case portion and including holes extending therethrough to receive the respective case mating medium to provide electrical connection thereto.

The capacitor case may further include: bumps, solder, or a conductive paste extending from the at least one auxiliary super capacitor to the printer circuit board to provide an electrical connection therebetween.

The capacitor case may further include bumps, solder, or a conductive paste extending from the at least one super capacitor to the printer circuit board to provide an electrical connection therebetween.

In the capacitor case, the at least on auxiliary super capacitor may include a first auxiliary super capacitor disposed on the upper portion of the internal case portion and a second auxiliary super capacitor disposed on the lower portion of the external case portion.

The case may include an upper part and a lower part separable from each other, the upper and the lower part each comprising upper and lower portions of the internal and external case portions, respectively, the upper part forming a first groove therein, and the lower part forming a second groove therein, such that the internal groove is formed by the first and second grooves.

The case mating medium may include a plurality of case mating mediums, each to extend through a corresponding hole extending through the internal and external case portions and the cavity.

The internal case portion may further include protrusions extending from the side portions thereof inward into the cavity to receive a printed circuit board containing the electrical components thereon, the printed circuit board including holes extending therethrough to receive respective ones the case mating mediums such that the electrical components are electrically connected with the at least one super capacitor.

The protrusions may include opposing protrusions to support opposite sides of the printed circuit board.

The internal case portion may include an internal groove therein to receive a printed circuit board containing the electrical components, the printed circuit board including holes therethrough to receive respective ones the case mating medium parts such that the electrical components are electrically connected with the super capacitor.

Features and utilities of the present general inventive concept may also be achieved by providing a super capacitor and SSD (solid state device) casing, including: an internal case portion including a top portion, side portions and a bottom portion to form a cavity, the internal case portion being surrounded by an external case portion such that a super capacitor is disposed between the internal portion and the external portion; and at least one solder bump to extend at one end through the internal case portion to contact the super capacitor and at another end into the cavity to provide an electrical connection between the super capacitor and electrical components to be disposed within the cavity.

The internal case portion may further include protrusions extending from opposite side portions thereof into the cavity to support a printed circuit board therein, the circuit board being connectable to the at least one solder bump when inserted into along the protrusions into the cavity.

Features and utilities of the present general inventive concept may also be achieved by providing a super capacitor and SSD (solid state device) casing, including: an upper case portion including a first internal part having a top portion and two opposing side portions to form a first internal groove therebetween, the top portion having a gap therein on a first side opposite the first internal groove to receive a super capacitor therein, and a first external part removably disposed on the top portion of the first internal part to enclose the super capacitor in the gap, the first internal part and the first external part having at least one hole extending therethrough; and a lower case portion including a second internal part having a bottom portion and two opposing side portions to form a second internal groove therebetween, the bottom portion having a gap therein on a first side opposite to the second internal groove to receive a super capacitor therein, and a second external part to be removably disposed on the bottom portion of the second internal part to enclose the super capacitor in the gap, the second internal part and the second external part having at least one hole extending therethrough in alignment with the at least one hole of the upper case portion; and a case mating medium to extend through the at least one hole of the upper casing portion and the lower case portion to electrically connect the respective super capacitors to electronic components disposed within the first and second internal grooves, wherein the side portions of the upper case portion connect to the side portions of the lower case portion such that the first and second internal grooves form a cavity.

The lower case portion may include protrusions extending inward from the side portions thereof to support a printed circuit board within the cavity and a predetermined distance from the bottom portion thereof.

The case mating mediums may extend from the upper case portion to the lower case portion and through holes in the printed circuit board to electrically connect the super capacitors and electrical components disposed on the printed circuit board.

The upper case portion and the lower case portion may further include a back portion including a protrusion connected to the protrusions of the side portions to support a back portion of the printed circuit board.

The printed circuit board may include electrical line patterns extending from components thereon to the holes therethrough to electrically connect the components to the case mating mediums.

Features and utilities of the present general inventive concept may also be achieved by providing a solid state device (SSD) casing, including a first case portion formed in a U-type shape with a flat portion and two opposing side portions, the flat portion having a first plurality of through holes therein; a second case portion formed in a U-type shape with a flat portion and two opposing side portions, the flat portion having a second plurality of through holes therein to correspond with respective ones of the first plurality of through holes, the two opposing side portions of the second case portion to connect with the two opposing side portion of the first case portion to form a cavity therebetween to receive the solid state device (SSD) module therein; at least one super capacitor disposed within the flat portion of at least one of the first case portion and the second case portion; and a case mating medium disposed through each corresponding set of the first and second plurality of through holes to electrically connect the SSD module and the at least one super capacitor.

The two opposing side portions of the second case portion where the two opposing side portions of the first case portion meets therewith may include protrusions extending inward toward each other into the cavity to receive the SSD module therein.

The SDD module may include a printed circuit board containing the electrical components thereon, the printed circuit board including holes extending therethrough to receive respective ones the case mating mediums such that the electrical components are electrically connected with the at least one super capacitor.

Additional features and utilities of the present general inventive concept will be set forth in part in the description which follows and, in part, will be obvious from the description, or may be learned by practice of the general inventive concept.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF EXEMPLARY EMBODIMENTS

Figure 1:
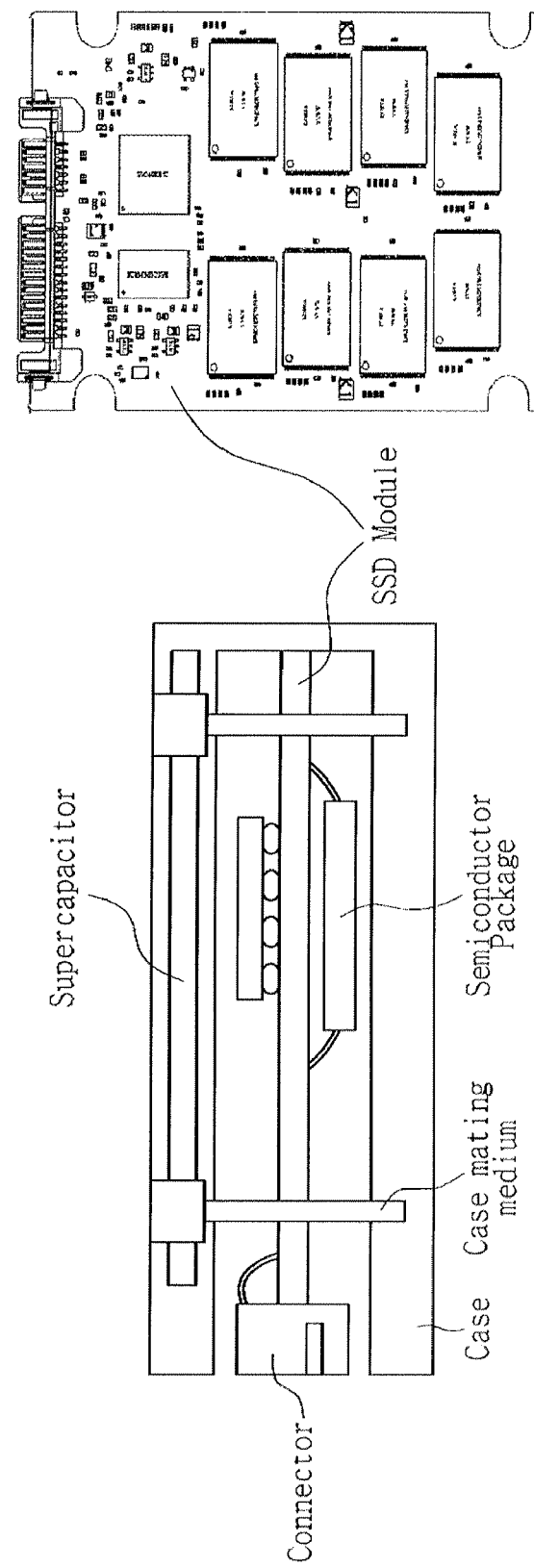
FIG. 1 illustrates a cross sectional view of a casing for an SSD (solid state device) including a super-capacitor embedded therein, according to an exemplary embodiment of the general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

FIG. 1 illustrates a cross sectional view of a casing to contain an SSD (solid state device) therein and also to embed one or more super-capacitors therein, according to an exemplary embodiment of the general inventive concept. The casing can operate to provide a physical connection as well as an electrical connection among the SSD and the super-capacitor(s) at the same time. Case mating mediums may also be provided as a connection between the super capacitors and components to be provided and/or disposed on the SSD module, such as, for example, semiconductor chips, a semiconductor package, etc. The case mating mediums can provide both a physical connection and an electrical connection between the SSD module and super capacitors and the casing itself.

Figure 2:
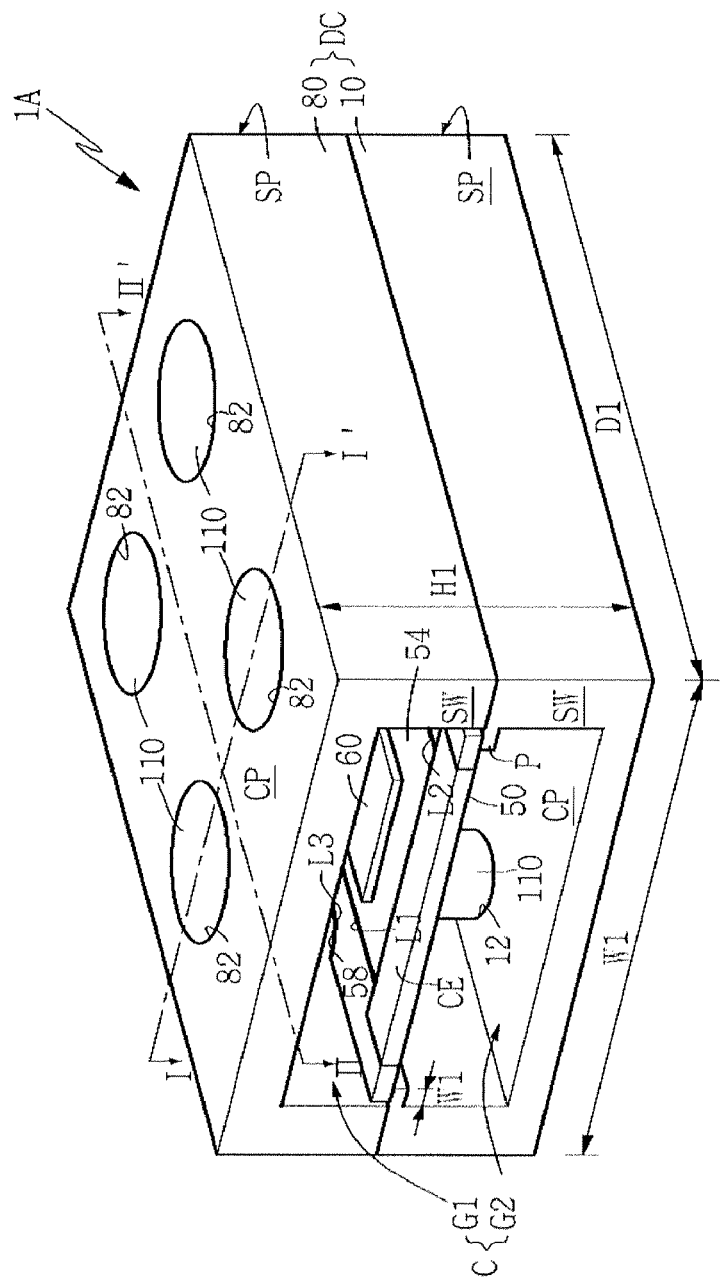
FIG. 2 illustrates a casing of an SSD and super-capacitors according to FIG. 1, where the driving case can include upper and lower casing parts and one or two super-capacitors, the super-capacitor may be in the upper or lower casing parts, or in both the upper and lower casing parts.

FIG. 2 illustrates a capacitor casing 1A of an SSD and super-capacitors according to FIG. 1, where the capacitor casing can include upper and lower casing parts and one or two super capacitors, the super capacitor(s) may be in either the upper or lower casing parts, or in both the upper and lower casing parts. More specifically, the casing 1 of FIG. 2 can include an upper casing part 80 and a lower casing part 10. Each of the casing parts (upper casing part 80 and lower casing part 10) are formed in a U-shape with a first flat surface (center part CP) and two opposing side walls (second and third surfaces SW) which extend from the first flat surface CP at opposite sides of the flat surface CP and in parallel with one another. The two opposing side walls/second and third surfaces (SW) of the upper casing part 80 can extend in parallel and away from the first flat surface CP thereof at a 90 degree angle to form a groove G1 therebetween, while the two opposing side walls (SW) of the lower casing part 10 can also extend in parallel and away from the first flat surface CP thereof at a 90 degree angle to form a second groove G2.

To form the entire casing 1A, the opposing side walls (SW) of the upper casing part 80 come together with the opposing side walls (SW) of the lower casing 10 such that the grooves G1 and G2 come together as a cavity (C) through the casing 1A, while the first flat surface CP of the upper casing part 80 can act as a top portion of the entire casing 1A while the first flat surface CP of the lower casing part 10 can act as a bottom portion of the entire casing 1A. In this embodiment, a super capacitor can be embedded within, for example, either or both of the first flat surface CP of the upper casing part 80 and the first flat surface CP of the lower casing portion 10 (not illustrated). Alternatively, a super capacitor can be embedded within the side walls SW of either or both of the upper casing part 80 and the lower casing portion 10 (not illustrated). The upper and lower casing parts 80 and 10 include an insulating material. Furthermore, the casing can be formed of a compound comprising at least one of Fe, Al, Ni, Cu, Au, Ag, Epoxy resin, polymer and SiO2.

The upper and lower casing parts 80 and 10 may have a width (W1) and depth (D1) as illustrated in FIG. 2, and when put together to form the casing 1A, they can have a height (H1) as illustrated in FIG. 2. While each of the upper and lower casing parts 80 and 10 can include the sidewalls (SW) as described above, one of the upper and lower casing parts 80 and 10 can also include opposing protrusions P which extend inward toward each other from the corresponding opposing side walls SW thereof to form a shelf like supporting structure. An SSD module 50 may be removably disposed within the cavity C such that the SSD module 50 slides along the opposing protrusions P into a middle section (center) of the cavity C. It is to be noted that the heights and depths of the casing parts 80 and 10 can be varied as desired or required in order to provide the intended purposes and operations of the various embodiments as described herein. For example, depending on the location of the super capacitors embedded within the walls CP and/or SW of either or both the upper and lower casing parts 80 and 10, the height and depth of the of the casing parts 80 and 10 can be varied.

As illustrated in FIG. 2, the SSD module 50 can include a connection electrode (CE) on a printed circuit board (PCB) 54, a memory device 60, a controller and/or other passive devices. Also provided are holes 12 and 82 disposed in the casing 1A to receive case mating mediums 110, as well as semicircular holes 58 disposed in the SSD module also to receive the case mating mediums 110, all to be described in more detail below.

Figure 3:
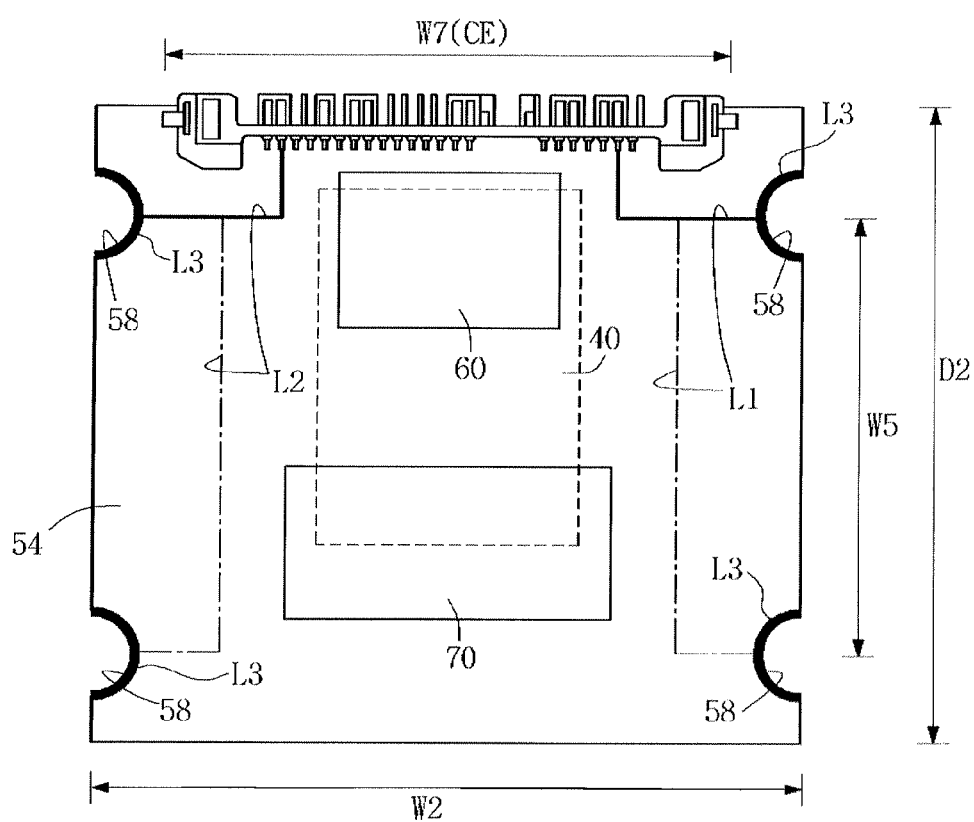
FIG. 3 illustrates an SSD module including a printed circuit board that can be inserted between and supported by the upper and lower cases of the driving case of FIG. 2.

FIG. 3 further illustrates an exemplary structure of the SSD module 50 including a printed circuit board 54, a connector, a nonvolatile memory device 40, a volatile memory device 60 and a controller 70, to be disposed within the casing 100 of FIG. 2. The SSD module 50 has a width W2 and a depth D2 which is less than width W1 and depth D1 of the upper and lower casings 80 and 10.

The SSD module 50 can also include a plurality of the partial holes 58 (semicircles) therein to accommodate case mating mediums (to be described in more detail infra) 110 that removably extend through holes form in the flat surface of the upper casing part 80 and lower casing part 10 (also to be described in more detail infra). These semicircular holes 58 may have power supplied thereto via pattern lines (L1 and L2) by being in contact with these pattern lines L1 and L2 via pattern lines L3 formed around the semicircular holes 58.

The nonvolatile memory 40 and the volatile memory 60 may be configured to be disposed at opposite sides respectively of the SSD module 50 (PCB 54) as illustrated by the dotted line representing the nonvolatile memory 40. Furthermore, in exemplary embodiments herein, a controller 70 may be disposed on the PCB 54 adjacent to the volatile memory 60.

The SSD module can include the width W2 and the depth D2, and a width W5 which represents an extension from a center of one of the semicircular holes 58 to a center of another one of the semicircular holes 58 along a same side of the SSD module 50 (along the depth D2 direction of the SSD module). A width W7 represents the width at which a connector electrode CE extends along the width W2 of the SSD module, where connection pins or other connector elements can be provided for connection of the SSD module to external devices or other related components.

Figure 4:
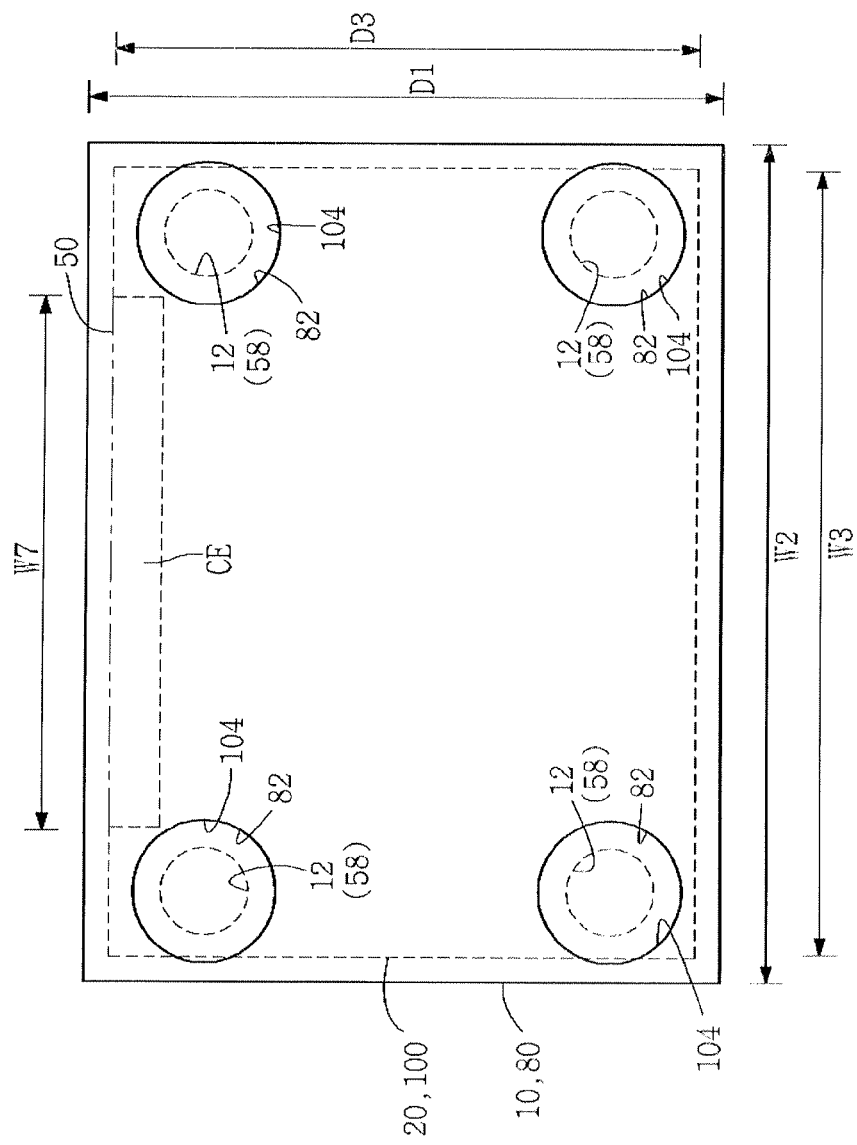
FIG. 4 illustrates a top view of the driving case of FIG. 3 with the SSD of FIG. 3 and super-capacitors supported therein, according to an exemplary embodiment of the general inventive concept.

FIG. 4 illustrates a top view of the casing 1 of FIG. 2 with the SSD of FIG. 3 and super-capacitors supported therein, according to an exemplary embodiment of the general inventive concept. Also illustrated in this exemplary embodiment is a super capacitor 20 and a super capacitor 100 which may be disposed in both of the upper and lower casing parts 80 and 10. Alternatively, the upper and lower casing parts 80 and 10 may include a super capacitor 20 or a super capacitor 100 in only the upper casing part 80 or the lower casing part 10, as described supra. The super capacitors 20 and 100 may have a width W3 and a depth D3, respectively. The width W3 and the depth D3 of the super capacitor(s) may be less than the width W2 and depth D2 of the SSD module 50.

In an exemplary embodiment, the lower casing part 10 has first holes 12 while the upper casing part 80 has second holes 82. The first holes 12 of the upper casing part 80 and the second holes 82 of the lower casing part 10 may be formed at same positions axially (same centers) while being different in size (diameters). In addition to the first and second holes, the super capacitor 20 and 101 may have third holes 104 extending therethrough to align with the first and second holes 12 and 82. The third holes 104, disposed at determined sides of the super capacitor 20/101, may expose contact terminals of the respective super capacitor(s) 20 and 100 to electrically connect to pattern lines L3 of the SDD module 50 illustrated in FIG. 3. Case mating mediums 110 can be inserted through the holes 12, 82 and 104 to electrically connect each of the super capacitors 20 and 100, the SSD module 50 and electrical components disposed thereon, and other intended electrical components, such as for example, other super capacitors to be described later. Similar to the casing itself, the case mating mediums 110 can be formed of a compound comprising at least one of Fe, Al, Ni, Cu, Au, Ag, Epoxy resin, polymer and SiO2.

Figure 5:
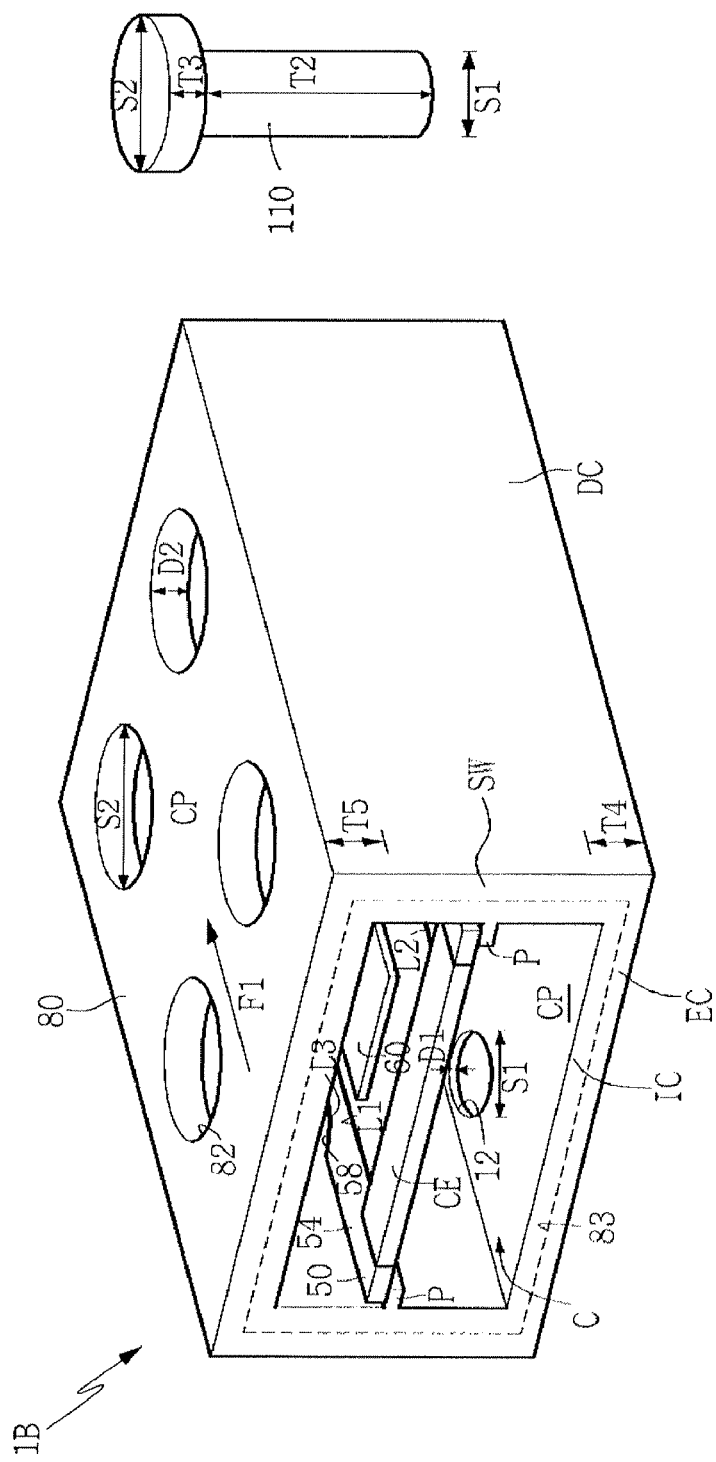
FIG. 5 illustrates a casing of an SSD and super-capacitors according to another embodiment of the general inventive concept.

FIG. 5 illustrates a casing 1B of an SSD module 50 and super-capacitors according to another exemplary embodiment of the general inventive concept. In this exemplary embodiment, the casing 1B of an SSD module may comprise one continuous casing 80 having a rectangular or square shape with two side walls (SW), a top and a bottom surface CP. The casing 80 may be formed of an insulating material, and the two side walls (SW) each may include a protrusion (P) extending therefrom inwardly and toward each other, similarly to the opposing protrusions P illustrated in the embodiment of FIG. 2. Furthermore, the casing 80 may include an inner part (IC) and an external part (EC) such that a cavity C is defined by the inner part IC. A dotted line illustrates the boundary region between the inner part IC of the casing 80 and the outer part EC of the casing 80.

The casing 80 may have first holes 12 that may or may not extend therethrough at the bottom surface CP thereof. The first holes 12 may have a diameter 51 and a depth D4. The casing 80 may also have third holes 82 formed to extend through the top surface CP thereof. It is to be noted that the descriptions of top surface and bottom surface can be interchangeable depending on the positioning of the casing 1B, and therefore is relative to the surface on which the casing attached or placed. The third holes 82 may have a diameter S2 and a depth D5. The first holes 12 and the third holes 82 may be formed to oppose each other in the bottom surface CP and the top surface CP, respectively, as illustrated.

A case mating medium 110 can be inserted into the casing 80 through the first holes 12 and the third holes 82. The case mating medium(s) 110 can have an upper diameter S3 and a lower diameter S4, and an upper thickness T1 and a lower thickness T2. The upper thickness T1 and the lower thickness T2 together should be long enough to extend from the top portion of the casing body 80 to the bottom portion of the casing body 1B such that the upper diameter S3 remains within the respective hole 82 while the lower diameter S4 extends into the respective hole 12. Arrangements and the number of case mating mediums 110 can vary as necessary to accommodate the various casing body 1 embodiments described herein, and that will provide the intended purposes of the inventive concept as described herein.

The case mating mediums 110 can be formed of a material which will provide electrical conductivity to provide an electrical contact, or a partial electrical contact, between the electrical components and super capacitors to be electrically connected to each other, as described previously.

As illustrated in FIG. 5, the internal IC and external EC casings of this exemplary embodiment can be separated from each other by applying a force F1 to one of the casings (IC or EC) with respect to the other. For example, if the force F1 is applied to the external casing EC as illustrated, the external casing EC will slide along an outer surface and away from the internal casing IC. Once the internal casing IC and the external casing EC are separated or partially separated from each other, a capacitor mounting portion (not illustrated) formed on an outer surface of the internal casing IC can be exposed to mount a super capacitor 20 or 100 therein. Then the super capacitor 20/100 and internal casing IC can be covered by the external casing EC by sliding the internal casing IC back into the external casing EC such that the super capacitor 20/100 is interposed between the external casing EC and the internal casing IC.

Figure 6:
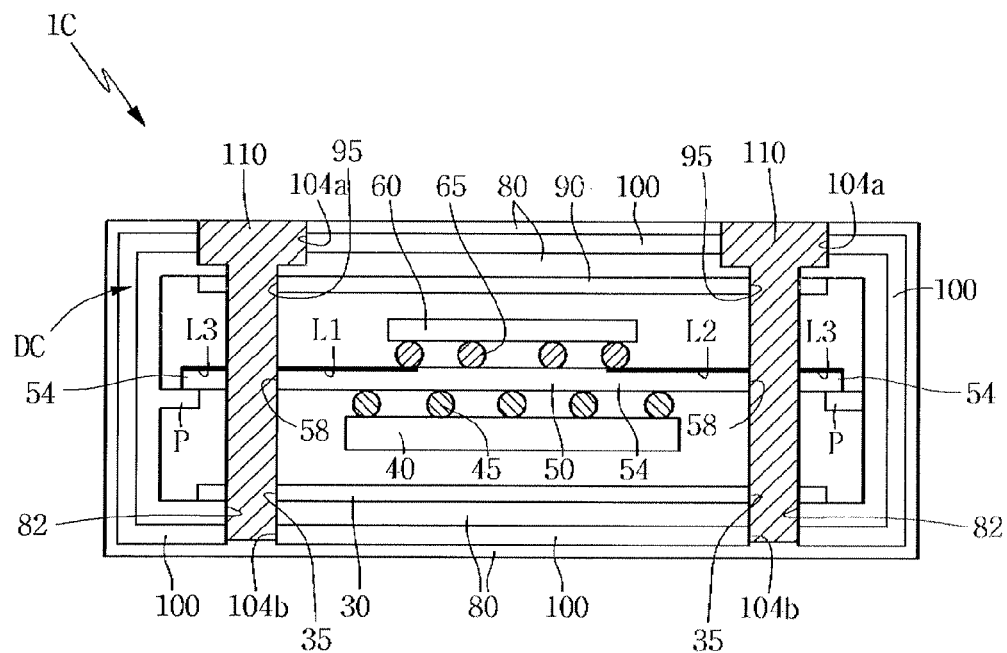
FIG. 6 illustrates a casing of an SSD and super-capacitors according to another exemplary embodiment of the inventive concept.

FIG. 6 illustrates a casing 1C of an SSD and super-capacitors according to another exemplary embodiment of the inventive concept. The casing 1C of this exemplary embodiment is similar to the casing of the previous embodiment. However, in this exemplary embodiment there can be additional super capacitors provided therein, such as, for example, a super capacitor 30 and a super capacitor 90, in addition to the super capacitor 20/100. For example, as illustrated in FIG. 6, while the super capacitor 100 is embedded between the internal casing IC and the external casing EC, the additional super capacitors 30 and 90 may be positioned within the cavity of the internal casing IC and attached thereto. Further, the additional super capacitors 30 and 90 may be electrically connected to the case mating medium(s) 110 via holes 35 of the super capacitor 30 and holes 95 of the super capacitor 90 to provide an electrical connection to other necessary components which are necessarily connected to the super capacitors 30 and 90, through, for example, the printed circuit board 54. The printed circuit board 54 can include holes 58 (described in more detail below) to receive the case mating medium(s) 110.

The super capacitor 100 of this embodiment of FIG. 6 can extend around the body (top, bottom and two sides) of the casing 1C between the inner part (IC) and an external part (EC) such that the top portion, the bottom portion and both side portions contain the super capacitor 100 embedded therebetween.

The holes 35 and 95 of the additional super capacitors 30 and 95, respectively, can overlap with the first holes 12 and second holes 82 of the casing 80. In this embodiment, as pointed out above, the super capacitor 100 extends all the way around the internal casing IC, and includes holes 104a and 104b disposed at the upper and lower parts of the internal casing IC and the external casing EC, respectively, to receive the case mating mediums 110. Accordingly, once the super capacitor 100 is disposed between the internal casing IC and the external casing EC by sliding the two casings apart and placing the super capacitor 100 on a surface of the internal casing IC, and then sliding the internal casing IC back within the external casing EC, and the super capacitor 30 is attached to an inner part of the lower portion of the internal casing IC while the super capacitor 90 is attached to an inner part of the upper portion of the internal casing IC, the case mating mediums 110 can be inserted through the holes 82, 104a, 35 and 95, holes 58 of the printed circuit board 54, and the holes 104b to make an electrical connection between the super capacitors 100, 30 and 90, and the printed circuit board 54 disposed on the opposing points P and within the cavity C.

The printed circuit board 54 can have several additional electronic devices attached thereto for electrical connection therebetween, including, for example, the volatile memory device 60, the nonvolatile memory device 40, and other electronic devices/components. Here the volatile memory device 60 is illustrated as being connected to the printed circuit board 54 via solder balls 65, and the nonvolatile memory device 40 is connected to the printed circuit board 54 via solder balls 45. Here, lines L1, L2 and L3 are illustrated as connecting the various components (i.e., volatile memory device 60 and nonvolatile memory device 40) of the printed circuit board 54 to the case mating medium(s) 110, which in turn electrically connect to the super capacitors 30, 90 and 100.

Figure 7:
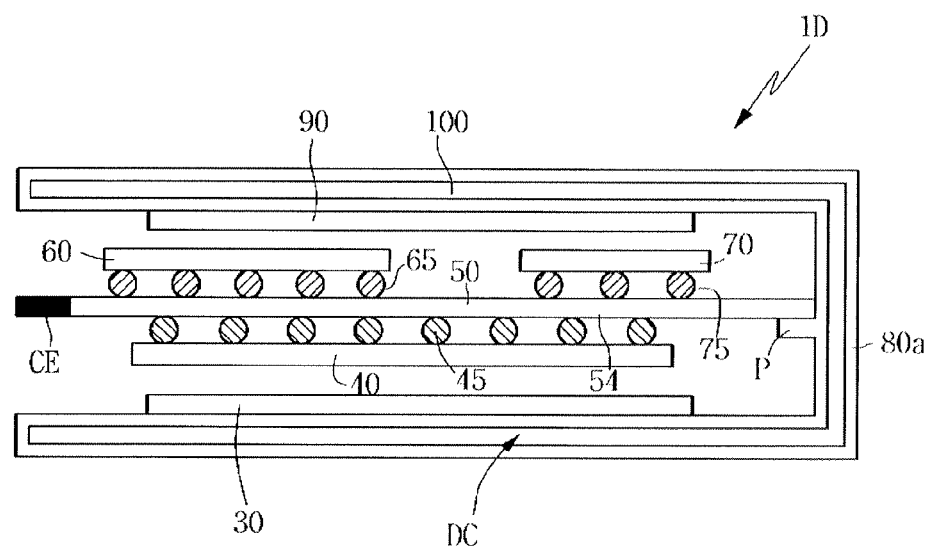
FIG. 7 illustrates a casing of an SSD and super-capacitors according to yet another exemplary embodiment of the inventive concept.
Figure 8:
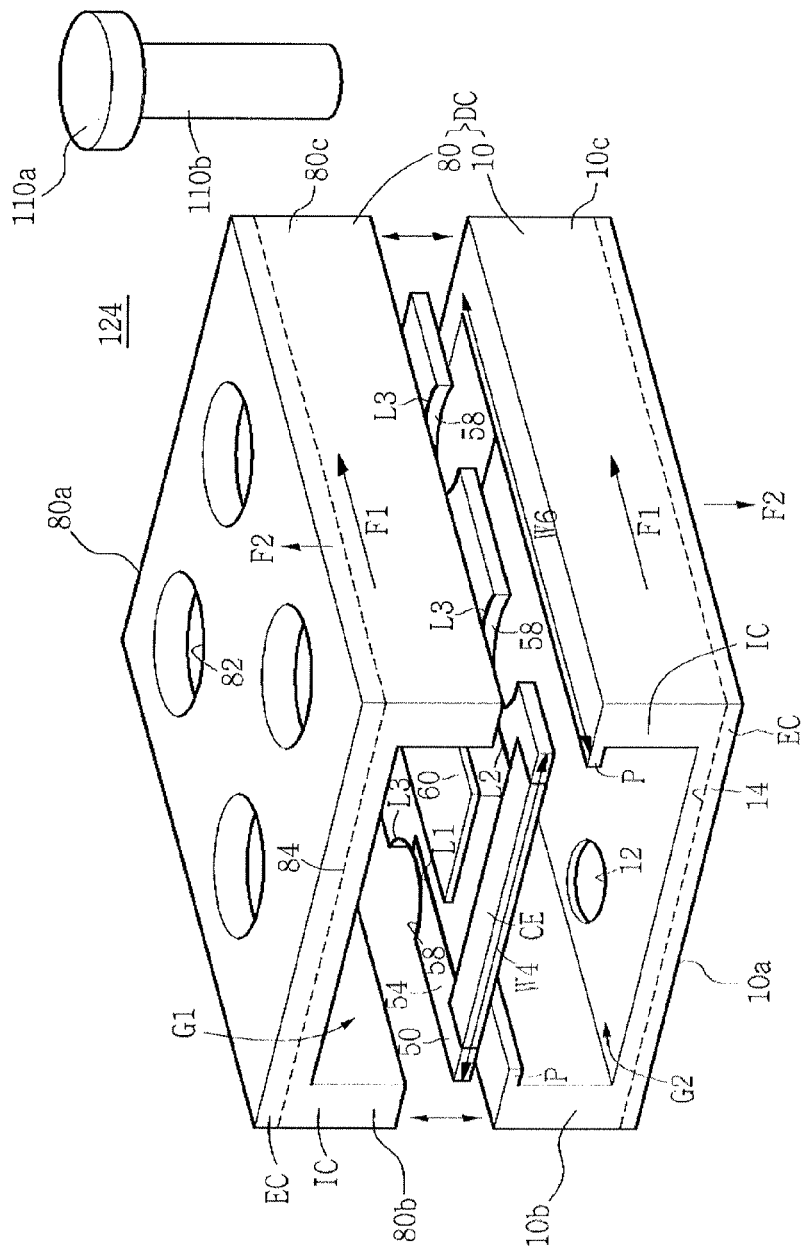
FIG. 8 illustrates a casing of an SSD and super-capacitors according to still another exemplary embodiment of the inventive concept.

FIG. 7 illustrates a casing 1D of an SSD and super-capacitors according to yet exemplary another embodiment of the general inventive concept. In this embodiment, in addition to the top portion, bottom portion and two sides of the casing body 1D, a back portion 80a can be provided. Further, the back portion 80a of the casing body 1D can include an extension of the super capacitor 100 embedded therein between the internal casing IC and the external casing EC. The inward extending protrusion P can also extend around to the back portion 80a of the casing body 1D as illustrated in FIG. 8. Furthermore, in addition to the volatile memory device 60 and nonvolatile memory device 40 being disposed on the printed circuit board 54, a controller 70 can also be disposed on the printed circuit board 54, and connected thereto via conductive medium(s) 75. The conductive mediums 45, 65 and 75 can be made of solder balls, solder paste or other conductive pastes.

Figure 7A:
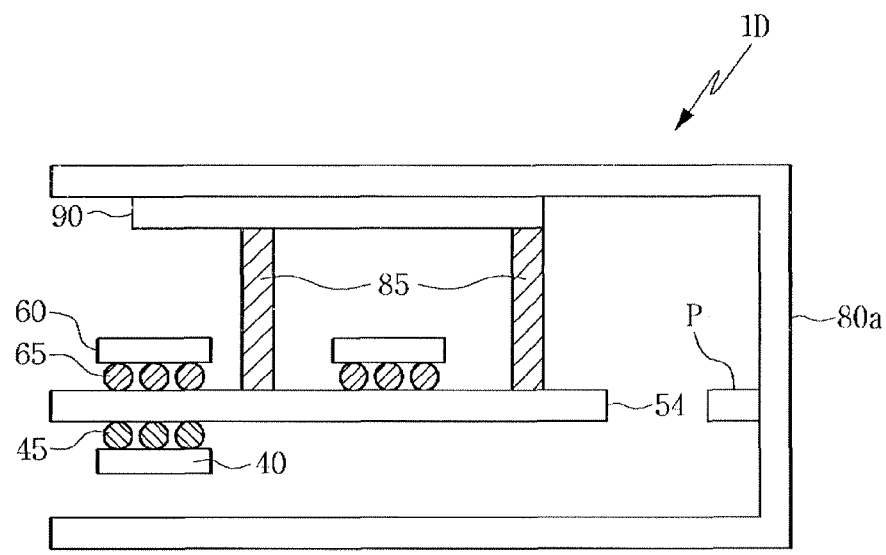
FIGS. 7A and 7B are alternative embodiments of the casing according to the exemplary embodiment of FIG. 7.

FIG. 7A illustrates an alternative embodiment of FIG. 7, wherein the printed circuit board 54 and the additional super capacitor 90 can be connected directly to each other via bumps, solder or a conductive paste. Alternatively, the printed circuit board 54 can be connected to the additional super capacitor 30 via bumps, solder or a conductive paste, or connected to both additional super capacitors 30 and 90 via bumps, solder or a conductive paste.

Figure 7B:
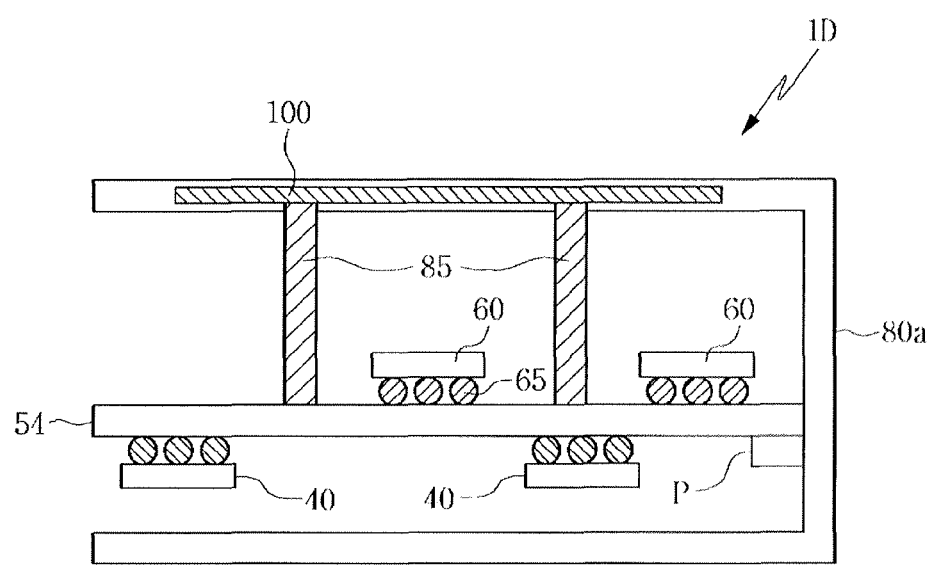

FIG. 7B illustrates another alternative embodiment of FIG. 7, wherein the printed circuit board 54 is connected directly to the super capacitor 100 embedded between the internal casing IC and the external casing EC by bumps 85 extending from the printed circuit board 54 through the internal casing IC to the super capacitor 100. Here, the internal casing IC and the external casing EC are attached via an adhesive such that the two casing are permanently connected to each other once the super capacitor 100 is disposed therebetween. The bumps 85 can be provided as solder bumps or a preformed conductive paste. This embodiment is convenient when the casing is formed at a manufacturing plant with one or more super capacitors 20/100 permanently formed therein, such as, for example, when the casing is manufactured to be disposable and replaceable rather than disassembling to replace the super capacitor with another.

FIG. 8 illustrates a casing of an SSD and super-capacitors according to still another exemplary embodiment of the general inventive concept. In the exemplary embodiment of FIG. 8, there is provided a casing 124 including an upper casing part 80 and a lower casing part 10, similar to the exemplary embodiment of FIG. 2. Each casing part 80 and 10 including an insulating material. Each of the upper casing part 80 and a lower casing part 10 can be separated from each other as illustrated. For example, a force F2 applied to the external casing EC can separate the external casing EC from the internal casing IC. Also, a force F1 applied to the internal casing IC can separate the external casing EC from the internal casing IC. In other words, the internal casing IC and the external casing EC can be separated from each other via a sliding force F1 with respect to each other, or a perpendicular force F2 with respect to each other.

Each of the upper casing part 80 and lower casing part 10 can be formed to have a flat surface part 80a/10a (where holes 82/12 are disposed, respectively) and two opposing side portions 80b and 80c (10b and 10c) extending from one side thereof at opposing ends of the flat surface part 80a/10a and in parallel with each other to form a U-shape with the flat surface part 80a/10a. Furthermore, the lower casing part 10 may include protrusions P which extend perpendicular from opposing side portions 10b and 10c, which in turn extend from the flat portion 10a thereof to form a partial shelf to support the printed circuit board 54 and SSD module 50. The upper casing portion 80 can include the holes 82 extending therethrough to receive case mating mediums 110, while the lower casing portion 10 may include the holes 12 extending therethrough (or partially therethrough) and aligned axially with the holes 82, also to receive the case mating mediums 110. The holes 82 may have a larger diameter than the holes 12 such that a head portion 110a of the case mating medium 110, which may be larger than a body portion 110b thereof, can securely fit into the holes 82 of the upper casing portion while the body portion 110*b* of the case mating medium 110 can securely fit into the holes 12 of the lower casing portion 10. Semicircular holes 58, as describe above, may be formed through the printed circuit board 54 to receive the body portion 110*b* of a respective one of the case mating mediums 110.

The upper casing portion 80 and the lower casing portion 10 include grooves G1 and G2, respectively. The grooves G1 and G2 are formed by the three walls 80*a*, 80*b* and 80*c*, and 10*a*, 10*b* and 10*c*, respectively.

Each of the upper casing portion 80 and the lower casing portion 10 can be formed of an internal casing IC and an external casing EC which are distinguished by a boundary 84 and 14, respectively. In this exemplary embodiment, the external casing EC of the upper casing portion 80 can be provided as a flat surface overlaying an outer portion of a flat surface of the internal casing IC of the upper casing portion 80 such that the two flat surfaces (EC and IC) are attached at the boundary line 84 (dotted line) to form the entire flat surface part 80*a* of the casing 124. Similarly, the external casing EC of the lower casing portion 10 can be provided as a flat surface overlaying an outer portion of the flat surface of the internal casing IC of the lower casing portion 10 such that the two flat surfaces (IC and EC) are attached at the boundary line 14 (dotted line) to form the entire flat surface part 10*a* of the casing 124.

In the internal casing IC of at least one of the upper casing portion 80 and the lower casing portion 10 can be formed a super capacitor 20 or 100. The respective super capacitor 20 or 100 can be covered with the external casing portion EC once embedded into a cavity of the outer surface of the internal casing portion IC.

As illustrated in the exemplary embodiment of FIG. 6, the super capacitors 20 and 100 can have holes 24 or 104, which align with the holes 12 of the lower casing portion 10 and the holes 82 of the upper casing portion 80 to receive the case mating mediums 110 therethrough. Then the case mating mediums 110 can be inserted through respective ones of the holes 82, 24, 104 and 12. Further, the case mating mediums 110 can also be inserted through the holes 58 formed in the printed circuit boards PCB 54 of the SSD modules 50. The holes 24 and 104 of the super capacitors 20 and 100 should be aligned with the holes of the upper and lower casing portions 80 and 10, and can be provided in a number of four holes, as illustrated in FIG. 8, or can be varied to correspond with any predetermined number of holes formed in the upper and lower casing portions 80 and 10.

Figure 9:
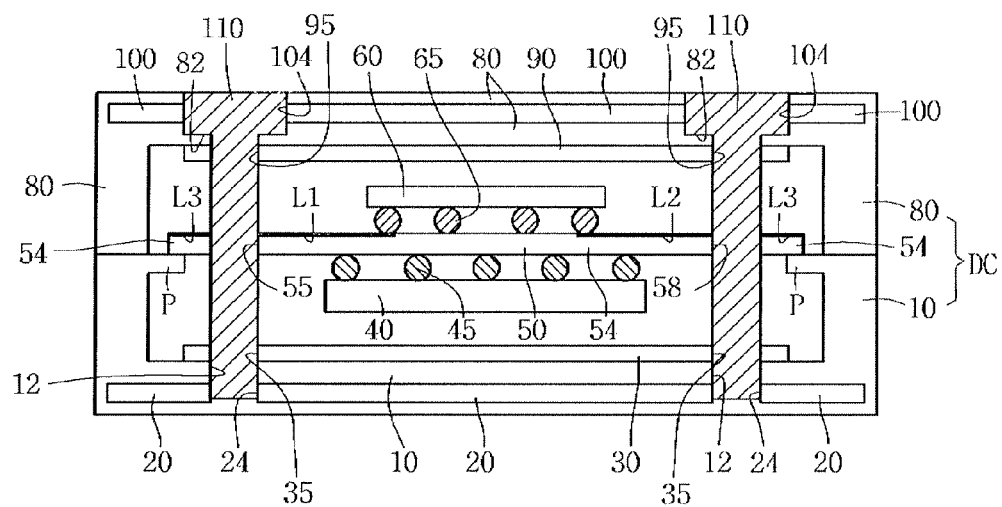
FIG. 9 illustrates a front view of the casing of the SSD and super-capacitors according to the exemplary embodiment of FIG. 8.

FIG. 9 illustrates a front view of the casing of the SSD and super-capacitors according to the exemplary embodiment of FIG. 8. Similar to the previous embodiment, this embodiment includes the upper casing portion 80, the lower casing portion 10, case mating mediums 110, a printed circuit board 54 disposed on the SSD module 50, and super capacitors 20 and 100. Here, the upper casing portion 80 includes a super capacitor 100 embedded between the internal casing IC and the external casing EC. Further, an additional super capacitor 90 is connected to an inner portion of the internal casing IC in the gap G1. The upper casing portion 80 includes four holes 82 extending therethrough, and the super capacitor 100 includes four holes 104 extending therethrough, while the additional capacitor 90 includes four holes 95 extending therethrough, all of the holes to receive a respective case mating medium 110.

The lower casing portion 10 includes a super capacitor 20 embedded between the internal casing IC and the external casing EC. Further, an additional super capacitor 30 is connected to an inner portion of the internal casing IC in the gap G2. The lower casing portion 10 includes four holes 12 extending at least partially therethrough to receive the respective case mating medium 110, and the super capacitor 20 includes four holes 24 extending therethrough, while the additional super capacitor 30 includes four holes 35 extending therethrough, all to receive a respective case mating medium 110.

As pointed out supra, the printed circuit board PCB 54 and SSD module 50 include four holes 58 extending therethrough to receive a respective case mating medium 110. The printed circuit board 54 can include a volatile memory device 60 disposed thereon and connected to the super capacitors 20, 30, 90 and 100 via the case mating mediums 110. Lines to connect the super capacitors to the case mating mediums include L1, L2 and L3, which are disposed on the printed circuit board 54. The printed circuit board 54 can also include a non-volatile memory device 40 disposed thereon opposite the volatile memory device 60.

Figure 10:
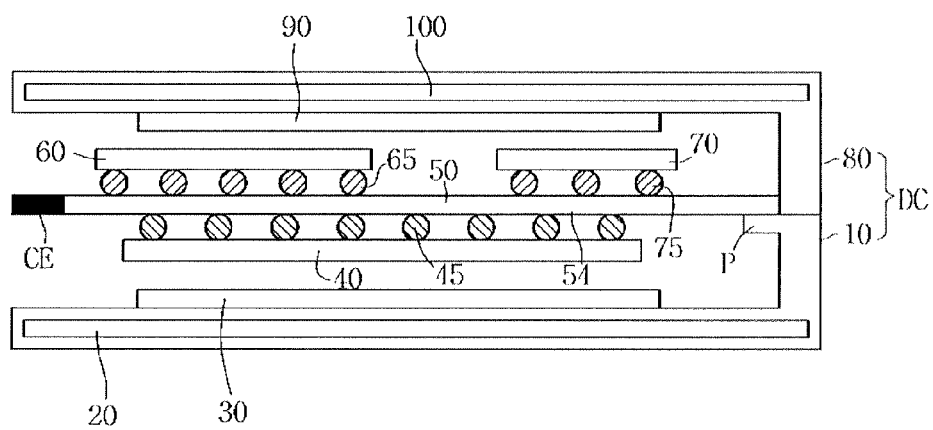
FIG. 10 illustrates a side view of the SSD and super-capacitors according to the exemplary embodiment of FIG. 8.

FIG. 10 illustrates a side view of the exemplary embodiment of FIG. 8. Here, as described above, the back of the casing 124 is closed due to the addition of a back wall portion DC formed by the internal casing IC of both the upper casing portion 80 and the lower casing portion 10. The back portion DC also includes the protrusion P that extends inward from the internal casing IC of the lower casing portion 10 to support a rear portion of the printed circuit board 54 and SSD module 50. The connection electrode CE extends from the front portion of the printed circuit board 54 at the opening of the casing 124.

Figure 11:
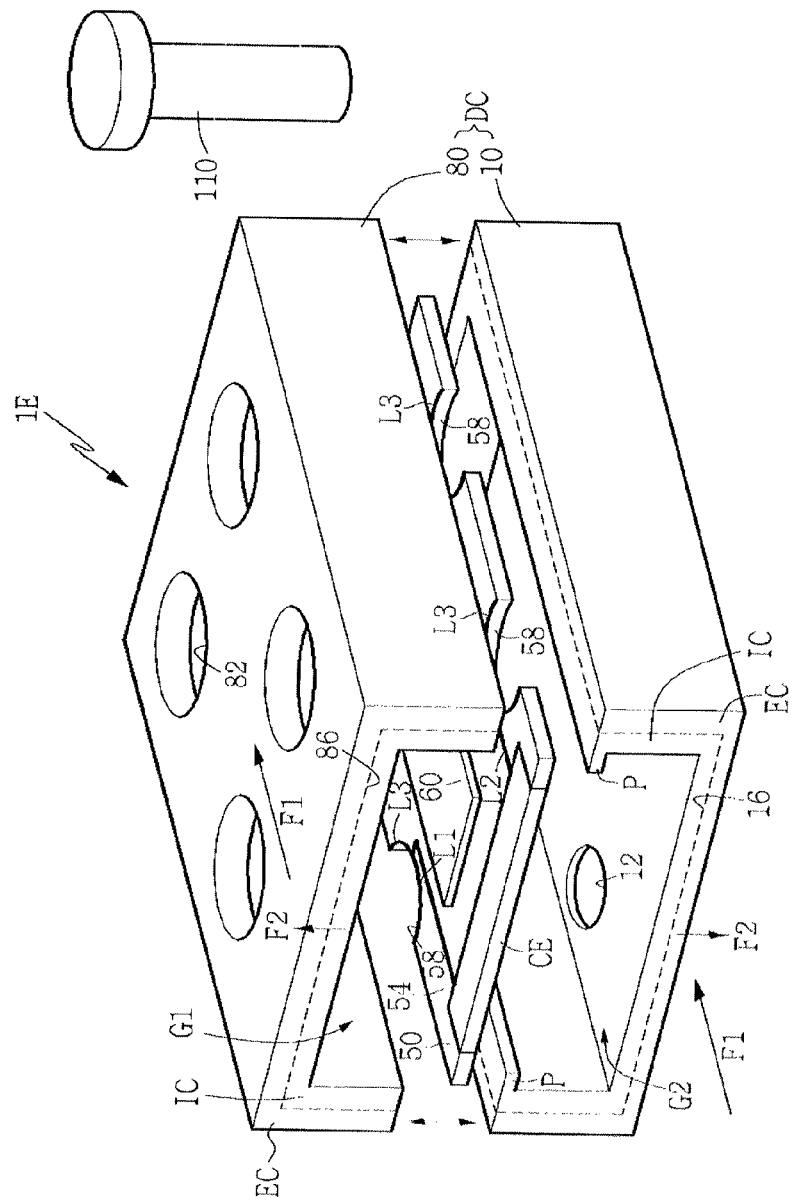
FIG. 11 illustrates a casing of an SSD and super-capacitors according to yet another exemplary embodiment of the inventive concept.

FIG. 11 illustrates a casing 1E of an SSD and super-capacitors according to yet another exemplary embodiment of the general inventive concept. In the exemplary embodiment of FIG. 11, the upper and lower casing portions 80 and 10 may include insulating material and may be separable from each other. For example, the upper and lower casing portions 80 and 10 may be distinguished by a boundary 86 and 16, respectively, between an internal casing IC and an external casing EC. The upper casing portion 80 and the lower casing portion 10 include a groove G1 and G2, respectively, formed in the front portion thereof, as illustrated, while the back portion is closed by a wall formed by the internal casing IC only. The internal casing IC forms the complete inner portion of the upper casing portion 80 and the lower casing portion 10, to form the groove G1 at the front portion while forming a wall at the back portion. The upper casing 80 and lower casing 10 form a combined casing DC.

Furthermore, the external casing EC also forms the complete outer portion of the upper casing portion 80 and the lower casing portion 10 to surround all of the internal casing IC except for the back portion, and therefore also forms a shape of grooves G1 and G2. However, no grooves are formed at the back portion of the casing portions 80 or 10 due to the wall formed only by the internal casing IC. The internal casing IC at the lower casing portion 10 extends inward at two ends to form inward extending points P to provide a ledge to support the SSD module 50 including the printed circuit board 54. Super capacitors 20 and 100 can be disposed between the internal casing IC and the external casing EC by separating the two casings from each other by applying a force F2 thereto such that a respective super capacitor 20, 100 can be disposed therebetween.

Similar to the previous exemplary embodiment, the upper and lower casing portions 80 and 10 can include holes 82 and 12, respectively, extending therein, to receive case mating mediums 110, while the printed circuit board 54 can include semicircular holes 58 to accommodate and make an electrical contact with the case mating mediums 110 to electrically connect components of the printed circuit board 54 and super capacitors 20, 30, 90 and 100 via electrical lines such as L1, L2 and L3.

Figure 12:
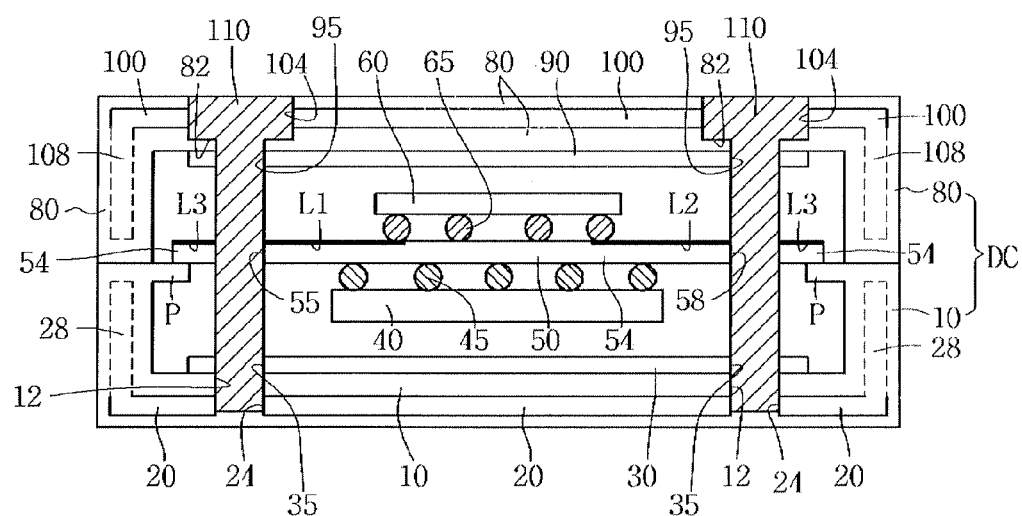
FIG. 12 illustrates a front view of the SSD and super-capacitors according to the exemplary embodiment of FIG. 11.

FIG. 12 illustrates a front view of the SSD casing 1E and super-capacitors according to the exemplary embodiment of FIG. 11. As illustrated in this exemplary embodiment, the super capacitors 100 and 20 may extend across the flat top and bottom surfaces, respectively, of the upper casing portion 80 and lower casing portion 10, between the internal casing IC and external casing EC, and also can further extend at a 90 degree angle along the side surfaces of the upper casing portion 80 and lower casing portion 10, and between the internal casing IC and external casing EC. The additional super capacitors 30 and 90 may also be included within the gaps G1 and G2, and have holes 35 and 95, respectively, to accommodate the case mating mediums 110 to extend therethrough. As illustrated in FIG. 12, the super capacitor 100 may have a first size hole 104 to securely accommodate the top portion of the case mating medium 110, while the super capacitor 20 may have a second size hole 24 to securely accommodate the lower portion of the case mating medium 110. The printed circuit board 54 can include semicircular holes 58 (see FIG. 3) as described supra, and also various electrical components as required.

Figure 13:
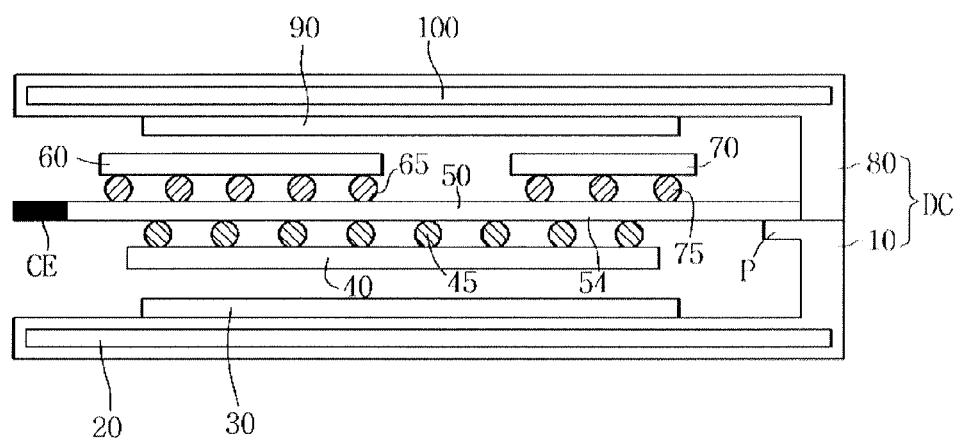
FIG. 13 illustrates a side view of the SSD and super-capacitors according to the exemplary embodiment of FIG. 11.

FIG. 13 illustrates a side view of the exemplary embodiment of FIG. 11. Here, as described above, the back portion of the combined casing DC is closed due to the addition of a wall formed by both the internal casing IC and the external casing EC at both the upper casing portion 80 and the lower casing portion 10. The back portion of the combined casing DC also includes the protrusion P extending from the lower casing portion 10 of the casing 126 to extend inward to support a rear portion of the printed circuit board 54 and SSD module 50.

Figure 14:
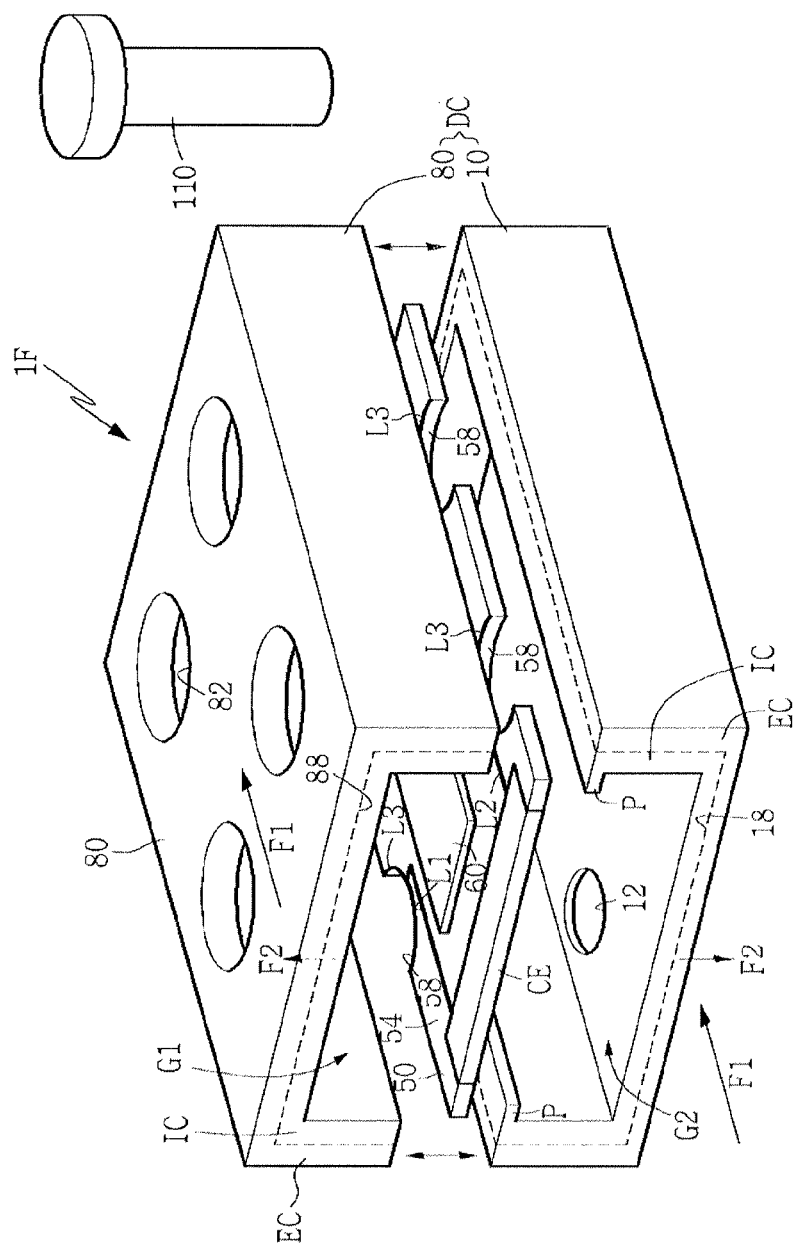
FIG. 14 illustrates a casing of an SSD and super-capacitors according to still another exemplary embodiment of the inventive concept.
Figure 15:
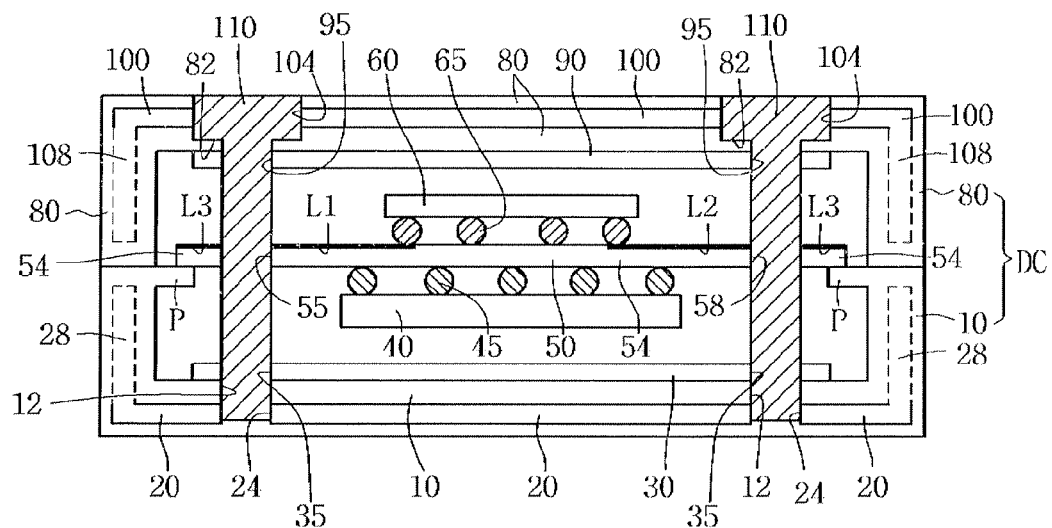
FIG. 15 illustrates a front view of an SSD and super-capacitors according to the exemplary embodiment of FIG. 14.

FIG. 14 illustrates a casing 128 of an SSD and super-capacitors according to still another exemplary embodiment of the general inventive concept. The embodiment of FIG. 14 is similar to the embodiment of FIG. 11, however, in the present exemplary embodiment of FIG. 14, the back portion of the combined casing DC (or casing 1F) is formed with both the internal casing IC and the external casing EC. With this configuration, the back portion can also contain at least a portion of a super capacitor 20 and 100 embedded therein between the internal casing IC and the external casing EC. For example, FIG. 15 illustrates a front view of the exemplary embodiment of FIG. 14, where a super capacitor 100 extends not only along the upper surface of the upper casing portion 80 between the internal casing IC and the external casing EC, but the super capacitor 100 includes an extending portion 108 that extends along the side portions of the upper casing portion 80 between the internal casing IC and the external casing EC. Further, a super capacitor 20 extends not only along the lower surface of the lower casing portion 10 between the internal casing IC and the external casing EC, but the super capacitor 20 includes an extending portion 28 that extends along the side portions of the lower casing portion 10 between the internal casing IC and the external casing EC.

Figure 16:
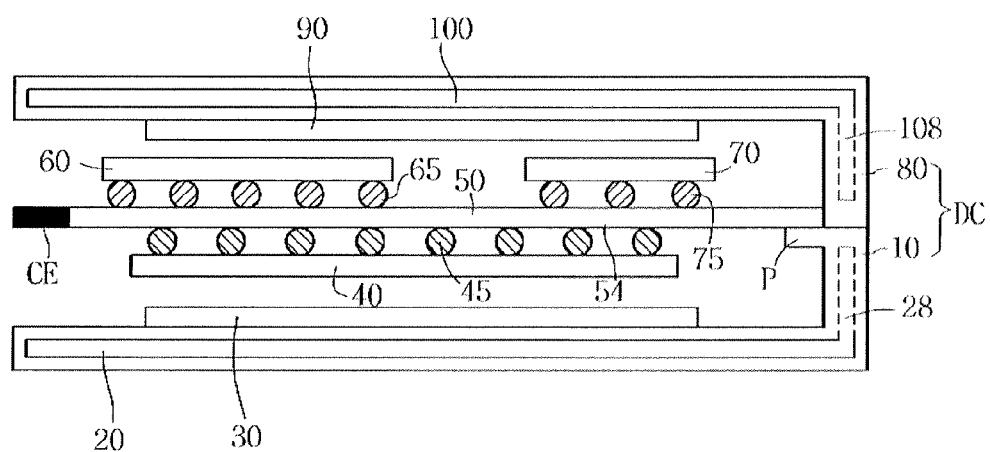
FIG. 16 illustrates a side view of an SSD and super-capacitors according to the exemplary embodiment of FIG. 14.

FIG. 16 illustrates a side view of the casing 128 according to the exemplary embodiment of FIG. 14. Here, as described above, the back portion of the combined casing DC is closed due to the addition of a back wall portion formed by the both internal casing IC and the external casing EC at both the upper casing portion 80 and the lower casing portion 10. Between the internal casing IC and the external casing EC of the upper casing portion 80 is an extension 108 of the super capacitor 100. Further, between the internal casing IC and the external casing EC of the lower casing portion 10 is an extension 28 of the super capacitor 20. The back portion also includes the protrusion P to extend inward from the lower casing portion 10 to support a rear portion of the printed circuit board 54 and SSD module 50.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A casing, comprising:
   a first case portion having a first plurality of through holes on a first surface thereof, the first case portion disposed on a second case portion to form a groove therebetween, the second case portion having a second plurality of through holes corresponding to respective ones of the first plurality of through holes, the groove configured to removably receive a solid state device (SSD) module therein;
   at least one super capacitor disposed on at least one of the first case portion and the second case portion; and
   a case mating medium disposed through each corresponding set of the first and second plurality of through holes to electrically connect the SSD module and the at least one super capacitor.

2. The casing of claim 1, wherein the SSD module includes a printed circuit board having a third plurality of through holes corresponding to respective ones of the first and second plurality of through holes to receive the case mating mediums therethrough.

3. The casing of claim 2, wherein:
   the SSD module including the printed circuit board has a width and depth less than a width and depth of the casing;
   and the third plurality of through holes are formed of semi-circles to surround a portion of the respective case mating medium extending therethrough.

4. The casing of claim 3, wherein:
   the first plurality of through holes has a diameter greater than a diameter of the second and third plurality of through holes; and
   the case mating mediums have a first portion including a first diameter to correspond with the diameter of the first plurality of through holes and a second portion including a second diameter to correspond with the diameter of the second and third plurality of through holes.

5. The casing of claim 1, wherein the first and second case portion are formed of a compound comprising at least one of Fe, Al, Ni, Cu, Au, Ag, Epoxy resin, polymer and SiO2.

6. The casing of claim 1, wherein the case mating medium is formed of a compound comprising at least one of Fe, Al, Ni, Cu, Au, Ag, Epoxy resin, polymer and SiO2.

7. A super capacitor and SSD case including a cavity therein, comprising:
   an internal case portion and an external case portion providing top, side and bottom portions of the cavity, the internal case portion including a gap formed on an outer surface thereof to receive a super capacitor therein, the internal case portion being insertable into the external case portion to enclose the super capacitor therebetween inside the gap; and
   at least one case mating medium to extend through a respective hole extending through the internal and external case portions and through the cavity to provide an electrical connection between the super capacitor and electrical components disposed within the cavity.

8. The case of claim 7, wherein the case mating medium comprises a plurality of case mating mediums, each to extend through a corresponding hole extending through the internal and external case portions and the cavity.

9. The case of claim 8, wherein the internal case portion further includes:
protrusions extending from the side portions thereof inward into the cavity to receive a printed circuit board containing the electrical components thereon, the printed circuit board including holes extending therethrough to receive respective ones the case mating mediums such that the electrical components are electrically connected with the at least one super capacitor.

10. The case of claim 9, wherein protrusions include opposing protrusions to support opposite sides of the printed circuit board.

11. The case of claim 10, wherein the internal case portion and an external case portion further include a back portion to close a back portion of the case, the back portion including a back protrusion extending inwardly therefrom to support a back portion of the printed circuit board.

12. The case of claim 11, wherein the gap extends into the back portion to receive a portion of the super capacitor therein.

13. The case of claim 10, further comprising:
at least one auxiliary super capacitor disposed on an internal surface of the internal case portion and including holes extending therethrough to receive the respective case mating medium to provide electrical connection thereto.

14. The case of claim 13, further comprising:
bumps, solder, or a conductive paste extending from the at least one auxiliary super capacitor to the printer circuit board to provide an electrical connection therebetween.

15. The capacitor case of claim 14, wherein the at least on auxiliary super capacitor comprises a first auxiliary super capacitor disposed on the upper portion of the internal case portion and a second auxiliary super capacitor disposed on the lower portion of the internal case portion.

16. The case of claim 9, further comprising:
bumps, solder, or a conductive paste extending from the at least one super capacitor to the printer circuit board to provide an electrical connection therebetween.

17. The capacitor case of claim 7, wherein the casing includes an upper part and a lower part separable from each other, the upper part and the lower part comprising upper and lower portions of the internal and external case portions, respectively, the upper part forming a first groove therein within the internal casing and the lower part forming a second groove therein within the internal casing such that the cavity is formed by the first and second grooves.

18. The capacitor of claim 17, wherein the case mating medium comprises a plurality of case mating mediums, each to extend through a corresponding hole extending through the internal and external case portions and the cavity.

19. The capacitor of claim 18, wherein the internal case portion further includes:
protrusions extending from the side portions thereof inward into the cavity to receive a printed circuit board containing the electrical components thereon, the printed circuit board including holes extending therethrough to receive respective ones the case mating mediums such that the electrical components are electrically connected with the at least one super capacitor.

20. The capacitor case of claim 19, wherein protrusions include opposing protrusions to support opposite sides of the printed circuit board.

21. The capacitor case of claim 20, wherein the internal case portion and an external case portion further include a back portion to close a back portion of the case, the back portion formed of the internal case portion only and including a back protrusion extending inwardly therefrom to support a back portion of the printed circuit board.

22. The capacitor case of claim 20, wherein the internal case portion and an external case portion further include a back portion to close a back portion of the case, the back portion formed of the internal case portion and the external case portion such that the gap extends along a portion of the back portion at both the upper part and the lower part to support an extended portion of the super capacitor therein.

23. The capacitor case of claim 22, wherein the back portion further includes a back protrusion extending inwardly therefrom to support a back portion of the printed circuit board.

24. A capacitor case, comprising:
an upper case portion including a first internal part having a top portion and two opposing side portions to form a first internal groove therebetween, the top portion having a gap therein on a first side opposite the first internal groove to receive a super capacitor therein, and a first external part removably disposed on the top portion of the first internal part to enclose the super capacitor in the gap, the first internal part and the first external part having at least one hole extending therethrough; and
a lower case portion including a second internal part having a bottom portion and two opposing side portions to form a second internal groove therebetween, the bottom portion having a gap therein on a first side opposite to the second internal groove to receive a super capacitor therein, and a second external part to be removably disposed on the bottom portion of the second internal part to enclose the super capacitor in the gap, the second internal part and the second external part having at least one hole extending therethrough in alignment with the at least one hole of the upper case portion; and
a case mating medium to extend through the at least one hole of the upper casing portion and the lower case portion to electrically connect the respective super capacitors to electronic components disposed within the first and second internal grooves,
wherein the side portions of the upper case portion connect to the side portions of the lower case portion such that the first and second internal grooves form a cavity.

25. The case of claim 24, wherein the lower case portion includes protrusions extending inward from the side portions thereof to support a printed circuit board within the cavity and a predetermined distance from the bottom portion thereof.

26. The case of claim 25, wherein the case mating mediums extend from the upper case portion to the lower case portion and through holes in the printed circuit board to electrically connect the super capacitors and electrical components disposed on the printed circuit board.

27. The case of claim 25, wherein the upper case portion and the lower case portion further include a back portion formed of the internal part to close the back portion of the case, the back portion including a protrusion connected to the protrusions of the side portions to support a back portion of the printed circuit board.

28. The case of claim 26, wherein the printed circuit board includes electrical line patterns extending from components thereon to the holes therethrough to electrically connect the components to the case mating mediums.

29. A solid state device (SSD) casing, comprising:
- a first case portion formed in a U-type shape with a flat portion and two opposing side portions, the flat portion having a first plurality of through holes therein;
- a second case portion formed in a U-type shape with a flat portion and two opposing side portions, the flat portion having a second plurality of through holes therein to correspond with respective ones of the first plurality of through holes, the two opposing side portions of the second case portion to connect with the two opposing side portion of the first case portion to form a cavity therebetween to receive the solid state device (SSD) module therein;
- at least one super capacitor disposed within the flat portion of at least one of the first case portion and the second case portion; and
- a case mating medium disposed through each corresponding set of the first and second plurality of through holes to electrically connect the SSD module and the at least one super capacitor.

30. The casing of claim 29, wherein the two opposing side portions of the second case portion where the two opposing side portions of the first case portion meets therewith includes protrusions extending inward toward each other into the cavity to receive the SDD module thereon.

31. The casing of claim 30, wherein the SDD module includes a printed circuit board containing the electrical components thereon, the printed circuit board including holes extending therethrough to receive respective ones the case mating mediums such that the electrical components are electrically connected with the at least one super capacitor.

* * * * *